United States Patent
Amthor et al.

(10) Patent No.: US 11,084,716 B2
(45) Date of Patent: Aug. 10, 2021

(54) STRESS REDUCTION DURING LASER RESEALING THROUGH A TEMPERATURE INCREASE

(71) Applicant: Robert Bosch GmbH, Stuttgart (DE)

(72) Inventors: Julia Amthor, Reutlingen (DE); Mawuli Ametowobla, Stuttgart (DE); Philip Kappe, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 582 days.

(21) Appl. No.: 15/776,341

(22) PCT Filed: Oct. 12, 2016

(86) PCT No.: PCT/EP2016/074473
§ 371 (c)(1),
(2) Date: May 15, 2018

(87) PCT Pub. No.: WO2017/097466
PCT Pub. Date: Jun. 15, 2017

(65) Prior Publication Data
US 2020/0270124 A1 Aug. 27, 2020

(30) Foreign Application Priority Data
Dec. 8, 2015 (DE) .......................... 102015224499.7

(51) Int. Cl.
*B81C 1/00* (2006.01)
*B81B 7/02* (2006.01)

(52) U.S. Cl.
CPC ............ *B81C 1/00293* (2013.01); *B81B 7/02* (2013.01); *B81C 1/00119* (2013.01);
(Continued)

(58) Field of Classification Search
CPC .............................................. B81C 2203/0145
See application file for complete search history.

(56) References Cited

U.S. PATENT DOCUMENTS

2005/0189621 A1    9/2005   Cheung
2008/0293178 A1*   11/2008   Rizzi .................. B81C 1/00285
                                                     438/50

(Continued)

FOREIGN PATENT DOCUMENTS

WO     2015/120939 A1    8/2015

OTHER PUBLICATIONS

International Search Report dated Nov. 21, 2016 of the corresponding International Application PCT/EP2016/074473 filed Oct. 12, 2016.

*Primary Examiner* — Moazzam Hossain
(74) *Attorney, Agent, or Firm* — Norton Rose Fulbright US LLP; Gerard Messina

(57) ABSTRACT

A method for producing a micromechanical component having a substrate and a cap that are connected to each other and that enclose a first cavity, where a first pressure prevails inside the first cavity and a first gas mixture having a first chemical composition is enclosed within the first cavity, includes, in a first method step, developing in the substrate or cap an access opening connecting the first cavity to an environment of the micromechanical component, in a second method step, setting the first pressure and/or the first chemical composition in the first cavity, in a third method step, sealing the access opening using a laser by introduction of energy or heat into an absorbing part of the substrate or the cap, and, in a fourth method step, performing a thermal treatment of the substrate or the cap, thereby reducing temperature gradients in the substrate or in the cap.

12 Claims, 2 Drawing Sheets

(52) U.S. Cl.
CPC ......... *B81B 2201/0235* (2013.01); *B81B 2203/0315* (2013.01); *B81C 2203/019* (2013.01); *B81C 2203/0145* (2013.01)

(56) References Cited

U.S. PATENT DOCUMENTS

| | | | |
|---|---|---|---|
| 2009/0174148 A1* | 7/2009 | Bischof | B81C 1/00293 277/316 |
| 2009/0205371 A1* | 8/2009 | Chen | B81C 1/00293 65/36 |
| 2014/0022718 A1 | 1/2014 | Yamazaki et al. | |
| 2016/0130137 A1* | 5/2016 | Huang | B81C 1/00285 257/415 |

* cited by examiner

STRESS REDUCTION DURING LASER RESEALING THROUGH A TEMPERATURE INCREASE

CROSS-REFERENCE TO RELATED APPLICATIONS

The present application is the national stage of International Pat. App. No. PCT/EP2016/074473 filed Oct. 12, 2016, and claims priority under 35 U.S.C. § 119 to DE 10 2015 224 499.7, filed in the Federal Republic of Germany on Dec. 8, 2015, the content of each of which are incorporated herein by reference in their entireties.

BACKGROUND

If a certain internal pressure is desired inside a cavity of a micromechanical component or if a gas mixture having a certain chemical composition is to be enclosed inside the cavity, then the internal pressure or the chemical composition is frequently adjusted when encapsulating the micromechanical component or during the bonding process between a substrate wafer and a cap wafer. During the encapsulation, for example, a cap is connected to a substrate, whereby the cap and the substrate jointly enclose the cavity. By adjusting the atmosphere or the pressure and/or the chemical composition of the gas mixture present in the environment during the encapsulation, it is therefore possible to adjust the specific internal pressure and/or the specific chemical composition inside the cavity.

Using a method known from WO 2015/120939 A1, it is possible to selectively adjust an internal pressure inside a cavity of a micromechanical component. More specifically, this method can be used to produce a micromechanical component having a first cavity, in which case a first pressure and a first chemical composition, which differ from a second pressure and from a second chemical composition, are adjustable inside the first cavity at the time of the encapsulation.

In the method for the selective adjustment of an internal pressure inside a cavity of a micromechanical component according to the document WO 2015/120939 A1, a narrow access channel to the cavity is created in the cap or in the cap wafer or in the substrate or in the sensor wafer. The cavity is then flooded with the desired gas and the desired internal pressure by way of the access channel. Finally, the region around the access channel is locally heated with the aid of a laser, the substrate material locally liquefying and hermetically sealing the access channel when solidifying.

SUMMARY

Example embodiments of the present invention provide a method for producing a micromechanical component that is mechanically robust and has a long service life in comparison with the related art, and that is performed in an uncomplicated and economical manner compared to the related art. Furthermore, example embodiments of the present invention provide a compact, mechanically robust micromechanical component, which has a long service life in comparison with the related art. This particularly applies to a micromechanical component having a (first) cavity. With the aid of the method according to the present invention and the micromechanical component according to the present invention, it is furthermore also possible to realize a micromechanical component in which a first pressure and a first chemical composition are adjustable inside the first cavity, and a second pressure and a second chemical composition are able to be adjusted inside a second cavity. For example, such a method is intended for the production of micromechanical components for which it is advantageous if a first pressure is enclosed inside a first cavity and a second pressure is enclosed in a second cavity, the first pressure differing from the second pressure. For example, this is the case when a first sensor unit for a rotation-rate measurement and a second sensor unit for an acceleration measurement are to be integrated into a micromechanical component.

This objective is achieved in that a thermal treatment of the substrate or the cap in order to reduce temperature gradients in the substrate or in the cap is performed temporally before and/or during a sealing of an access opening.

This provides a simple and cost-effective method for producing a micromechanical component, which method is able to reduce temperature gradients in the substrate or in the cap with the aid of a thermal treatment of the substrate or the cap. As a result, it is advantageously possible to selectively introduce additional energy or additional heat into the substrate or into the cap even prior to a first transition of the material region from the solid to the liquid state of aggregation and also following a second transition of the material region from the liquid to the solid state of aggregation. Due to heat conduction in the substrate or in the cap, regions of the substrate or the cap that abut the material region or the absorbing part of the substrate or the cap are therefore able to be brought to a higher temperature in comparison with the related art, temporally prior to the first transition and temporally following the second transition. The temperature gradients in the substrate or in the cap, in particular in the region of the access opening, are reduced in comparison with the related art. This makes it possible to mutually adjust the thermal expansion in a temperature increase and/or the thermal shrinkage in a temperature reduction of adjacent regions in the substrate or in the cap, especially in the region of the access opening, so that the mechanical stresses that occur in the region of the sealed access opening are able to be reduced in comparison with the related art.

By selectively increasing the temperature in the material surrounding the material region or welding spot, the method according to the present invention in particular makes it possible to reduce temperature gradients between the only recently solidified material region or welding spot and the material that surrounds the material region or the welding spot in comparison with the related art. More specifically, these temperature gradients are able to be reduced at the instant when the welding spot solidifies or temporally shortly after the welding spot has solidified.

Therefore, it is advantageously possible that the thermal shrinkage of the material region or the welding point essentially corresponds to the thermal shrinkage of the material surrounding the material region, or that the two thermal shrinkages are able to be adapted to each other. In an advantageous manner, the mechanical stresses that occur in the region of the sealed access opening, especially temporally after the material region has cooled, are able to be reduced in comparison with the related art.

According to the present invention, temperature gradients are less critical at an instant when the material region is in a liquid state of aggregation or is in the melting state because the material region is essentially free of stresses at this moment. However, it is provided according to the present invention, for instance, that the temperature gradients are reduced in comparison with the related art also at the instant at which the material region is in a liquid state of aggregation. More specifically, it is avoided according to the present invention, or there is less of a risk that stresses build up temporally after the solidification of the material region due to the recently solidified material region being hotter and thus being subject to a stronger/different thermal expansion during the cooling process than the colder material surrounding the material region. According to the present invention, the temperature gradient in the material or in the substrate or in the cap is kept as low as possible during the solidification of the material region or the welding spot and also during the cooling, so that the mechanical stresses that remain in the component after the cooling are kept to a minimum.

Another advantage of the method according to the present invention is that the selective introduction of the energy or heat into the substrate or into the cap temporally already before the first transition and/or temporally after the second transition makes it possible to thermally activate the movement of dislocations. As a result, due to thermally activated dislocation movements or due to easier dislocation movements, it is advantageously possible that the substrate or the cap is at least in part plastically deformable or is at least in part locally deformable in the region of the access opening, in particular temporally prior to the first transition and/or temporally following the second transition. With the aid of the selective introduction of the energy or heat, locally occurring stresses or stress peaks are therefore able to be reduced or dissipated through a plastic deformation in comparison with the related art.

The method according to the present invention is particularly advantageous for a method in which a laser spot-welding method is used in the third method step because the method according to the present invention makes it possible to effectively reduce stresses that are introduced into the material or to redistribute such stresses to regions that lie at a greater distance from the access opening, due to point welds locally in the region of the access opening or in the region of the sealed access opening. The dissipation or reduction of locally occurring stresses is particularly advantageous inasmuch as it allows for an increase in the resistance to the formation of tears in comparison with the related art, so that the probability of component failure directly after the sealing of the access opening or during the further processing of the micromechanical component or over the service life of the product is able to be reduced in comparison with the related art.

In the context of the present invention, a thermal treatment of the substrate or the cap essentially means the introduction of further energy or further heat into the substrate or into the cap. The further energy or further heat according to the present invention means energy or heat that has been introduced into the absorbing part of the substrate or the cap with the aid of a laser in addition to the energy or heat during the sealing of the access opening in the third method step. In this context it is provided, for instance, that the further energy or heat be introduced into a further absorbing part of the substrate or the cap. For example, it is provided that the absorbing part of the substrate or the cap and the further absorbing part of the substrate or the cap at least partially overlap in space. Alternatively, it is also provided, for instance, that the absorbing part of the substrate or the cap and the further absorbing part of the substrate or the cap are spaced apart from each other.

In the context of the present invention, the term 'micromechanical component' is to be understood as encompassing both micromechanical and micro-electromechanical components.

Example embodiments of the present invention are directed to production of a micromechanical component or for a micromechanical component having a cavity. However, the present invention is also provided for a micromechanical component having two cavities, for instance, or having more than two, such as three, four, five, six, or more than six cavities.

The access opening is preferably sealed by introducing energy or heat into a part of the substrate or the cap that absorbs this energy or this heat, using a laser for this purpose. Energy or heat is preferably introduced into the respective absorbing part of the substrate or the cap of a plurality of micromechanical components, which are jointly produced on a wafer, for example, the introduction taking place temporally one after the other. However, a temporally parallel introduction of the energy or heat into the respective absorbing part of the substrate or the cap of a plurality of micromechanical components is also provided as an alternative, e.g., using multiple laser beams or laser devices.

According to one preferred further development, the cap encloses a second cavity together with the substrate, and a second pressure prevails in the second cavity and a second gas mixture having a second chemical composition is enclosed.

According to the present invention, it is particularly provided that a thermal treatment of the substrate or the cap that reduces temperature gradients in the substrate or in the cap is performed temporally before and/or temporally during laser sealing of an access opening. This advantageously makes it possible to reduce temperature gradients in the substrate or in the cap temporally before and/or temporally during the sealing of the access opening. Alternatively or additionally, however, it is also provided that the thermal treatment be carried out temporally following the laser sealing. This advantageously allows for a reduction of temperature gradients in the substrate or in the cap temporally following the sealing of the access opening.

According to an example embodiment, the substrate temperature and/or the cap temperature is/are globally increased or is/are locally increased around the access opening temporally before the laser sealing, i.e., before the laser sealing of the access opening, so that the temperature gradients that prevail during the re-solidification of the material region are reduced.

According to an example embodiment, the thermal treatment includes bringing the substrate and the cap to a higher temperature, or bringing a lateral region at a surface of the substrate or the cap facing away from the first cavity is to a higher temperature. This advantageously makes it possible to use the method according to the present invention for carrying out both global thermal treatments in the sense of thermal treatments of the entire substrate or the entire cap, and local thermal treatments in the sense of thermal treatments of subregions of the substrate or the cap. In this context it is advantageous, in particular in a global thermal treatment, that dislocation movements are made easier essentially in the entire substrate or in the entire cap, so that stresses in the region of the access opening are able to be dissipated in a particularly advantageous manner, or are able to be redistributed to the entire cap or to the entire substrate. In a local thermal treatment, it is particularly advantageous that only a slight energy quantity or heat quantity is required in order to activate the dislocation movements and that possibly present temperature-sensitive parts of the component are shielded from the increased temperature or that the possible temperature increase in the material surrounding the ventilation hole or the access opening is not restricted by possibly present temperature-sensitive parts at another location in the component.

According to an example embodiment, the thermal treatment is carried out on a heating plate and/or with the aid of homogeneous irradiation. This advantageously makes it possible to carry out a global thermal treatment in a particularly simple and economical manner.

According to an example embodiment, the thermal treatment is performed with the aid of a spatially restricted heat source. In an advantageous manner, this allows for the selective introduction of a small quantity of energy or heat into the substrate or into the cap for the activation of dislocation movements. In addition, it ensures that possibly present temperature-sensitive parts of the component will not be affected by the increased temperature and that the possible temperature increase in the material that surrounds the ventilation hole or the access opening is not restricted by possibly present temperature-sensitive parts at another location in the component.

According to an example embodiment, the thermal treatment is carried out using a further laser, a light-emitting diode (LED), and/or a flash lamp. This advantageously makes it possible to carry out a local thermal treatment in a particularly simple and cost-effective manner.

According to an example embodiment, the formation of the access opening is carried out temporally before the bonding process. In an advantageous manner, the bonding process can thereby be performed with an open access opening. According to an alternative example embodiment, the formation of the access opening is carried out temporally following the bonding process, which advantageously makes it possible that the substrate and the cap are already connected to each other when opening the access opening.

According to an example embodiment of the present invention, a micromechanical component includes a substrate and a cap that are connected to each other and that enclose a first cavity. A first pressure prevails in the first cavity and a first gas mixture having a first chemical composition is enclosed, and the substrate or the cap includes a sealed access opening, the substrate or the cap having a region around the sealed access opening that features low stresses due to a performed thermal treatment of the substrate or the cap. This advantageously provides a compact, mechanically robust, and cost-effective micromechanical component having a set first pressure. The mentioned advantages of the method according to the present invention correspondingly apply also to the micromechanical component according to the present invention.

According to an example embodiment, the substrate and/or the cap include(s) silicon. This advantageously makes it possible to produce the micromechanical component utilizing production methods of layer technology known from the related art.

According to an example embodiment, the cap encloses a second cavity together with the substrate, a second pressure prevailing in the second cavity and a second gas mixture having a second chemical composition being enclosed. This advantageously provides a compact, mechanically robust, and cost-effective micromechanical component having a set first pressure and second pressure.

According to an example embodiment, the first pressure is lower than the second pressure, a first sensor unit for a rotation-rate measurement is disposed in the first cavity, and a second sensor unit for an acceleration measurement is disposed in the second cavity. This advantageously provides a mechanically robust micromechanical component for a rotation-rate measurement and for an acceleration measurement that offers optimal operating conditions both for the first sensor unit and the second sensor unit.

Advantageous embodiments and further developments of the present invention can be gathered from the following description with reference to the drawings in which identical parts are provided with the same reference numerals in the various figures and therefore may generally also denoted or mentioned only once.

DETAILED DESCRIPTION

Figure 1:
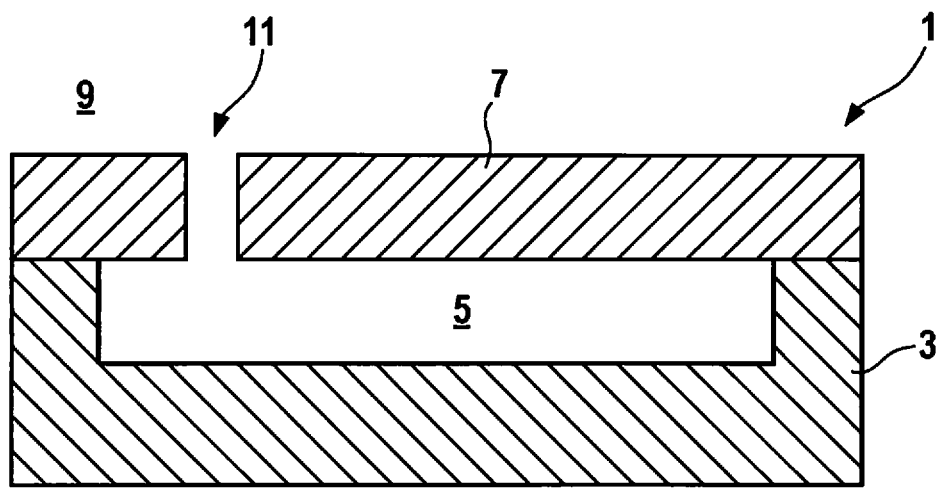
FIG. 1 schematically shows a micromechanical component with an open access opening according to an example embodiment of the present invention.
Figure 2:
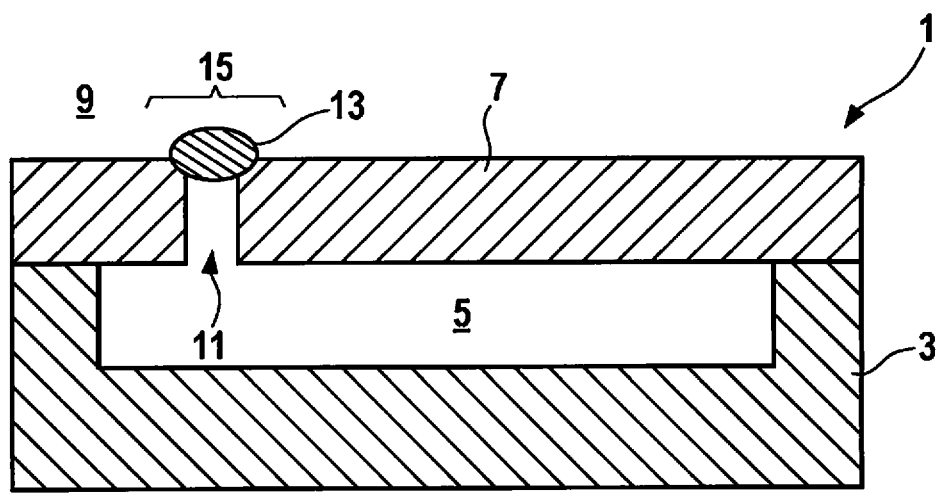
FIG. 2 schematically shows the micromechanical component according to FIG. 1 with a sealed access opening according to an example embodiment of the present invention.

FIGS. 1 and 2 show a schematized representation of a micromechanical component 1, with an open access opening 11 in FIG. 1 and with a sealed access opening 11 in FIG. 2, according to an exemplary embodiment of the present invention. Micromechanical component 1 includes a substrate 3 and a cap 7. Substrate 3 and cap 7 are connected to each other, preferably hermetically, and jointly enclose a first cavity 5. For example, micromechanical component 1 is developed in such a way that substrate 3 and cap 7 additionally and jointly enclose a second cavity. However, the second cavity is not shown in FIGS. 1 and 2.

For example, a first pressure prevails inside first cavity 5, especially if access opening 11 is sealed, as shown in FIG. 2. In addition, a first gas mixture having a first chemical composition is enclosed inside first cavity 5. Moreover, a second pressure prevails inside the second cavity, for instance, and a second gas mixture having a second chemical composition is enclosed inside the second cavity. Access opening 11 is preferably disposed in substrate 3 or in cap 7. In this particular exemplary embodiment, access opening 11 is situated in cap 7 by way of example. However, according to the present invention it can alternatively also be provided that access opening 11 be situated in substrate 3.

It is provided, for instance, that the first pressure in first cavity 5 be lower than the second pressure in the second cavity. It is also provided, for example, that a first micromechanical sensor unit for a rotation-rate measurement, which is not shown in FIGS. 1 and 2, be situated in first cavity 5, and that a second micromechanical sensor unit for an acceleration measurement, which is not shown in FIGS. 1 and 2, be disposed in the second cavity.

Figure 3:
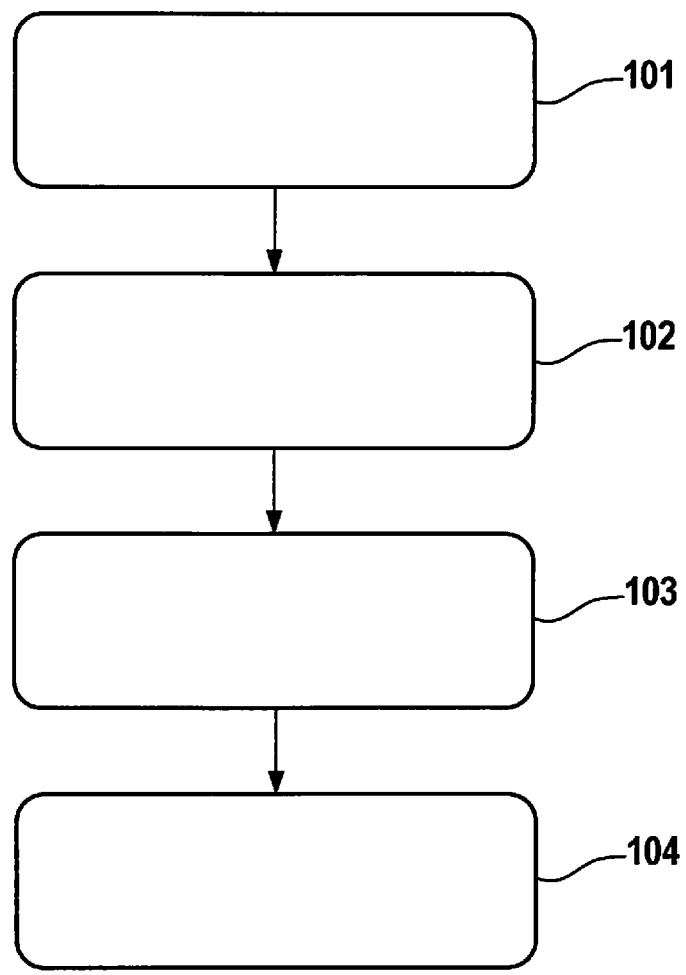
FIG. 3 is a flowchart that illustrates a method for producing a micromechanical component according to an example embodiment of the present invention.

FIG. 3 shows a method for producing micromechanical component 1 in a schematized representation according to an exemplary embodiment of the present invention. In a first method step 101, access opening 11, in particular a narrow access opening, which connects first cavity 5 to an environment 9 of micromechanical component 1, is developed in substrate 3 or in cap 7. FIG. 1 exemplarily shows micromechanical component 1 following first method step 101. In a second method step 102, the first pressure and/or the first chemical composition is/are set inside first cavity 5, or first cavity 5 is flooded with the desired gas and the desired internal pressure via the access channel. In a third method step 103, access opening 11 is sealed using a laser by introducing energy or heat into an absorbing part of substrate 3 or cap 7. As an alternative, it is also provided by way of example that, in third method step 103, the region around the access channel is preferably heated only locally with the aid of a laser, and the access channel is hermetically sealed. This advantageously makes it possible to provide the method of the present invention also for use with energy sources other than a laser for the sealing of access opening 11. FIG. 2 exemplarily shows micromechanical component 1 following third method step 103.

Temporally after third method step 103, mechanical stresses can occur in a lateral region 15, exemplarily shown in FIG. 2, of micromechanical component 1, on a surface of cap 7 facing away from cavity 5 and also in depth, perpendicular to a projection of lateral region 15 onto the surface, i.e., along access opening 11 and in the direction of first cavity 5. These mechanical stresses, especially local mechanical stresses, prevail in particular at and in the vicinity of a boundary surface between a material region 13 of cap 7 that transitions to a liquid state of aggregation in third method step 103 and to a solid state of aggregation following third method step 103 and seals access opening 11, and a residual region of cap 7 that remains in a solid state of aggregation during third method step 103. In FIG. 2, material region 13 of cap 7 sealing access opening 11 should be considered merely as a schematic depiction, especially with regard to its lateral extension or shape extending in particular parallel to the surface, and especially with regard to its extension or configuration running perpendicular to the lateral extension, in particular perpendicular to the surface.

FIG. 3 exemplarily shows a fourth method step 104 in which a thermal treatment of substrate 3 or cap 7 is carried out in order to reduce temperature gradients in substrate 3 or in cap 7. In this context, for instance, it is provided that fourth method step 104 be carried out temporally before, during, and/or after third method step 103. Fourth method step 104 is preferably performed temporally before and/or temporally during third method step 103. Alternatively or additionally, however, it is also provided that fourth method step 104 be carried out temporally after third method step 103.

For example, it is provided that the thermal treatment be carried out with the aid of a heat source. According to the present invention, for instance, the term 'heat source' encompasses all devices that are capable of allowing for the introduction of the further energy or the further heat into the substrate or into the cap.

In addition, it is provided, for instance, that, in fourth method step 104, substrate 3 and cap 7, a lateral region 15 at a surface of substrate 3 or cap 7 that faces away from first cavity 5, or an environment of the welding spot is brought to a higher temperature. It is also provided, for instance, that multiple substrates 3 or caps 7 or micromechanical components 1 of a wafer are brought to a higher temperature in fourth method step 104. It is likewise provided, for example, that multiple wafers of a wafer stack are brought to a higher temperature in fourth method step 104.

In the event that substrate 3 and cap 7 are brought to a higher temperature, it is provided, for instance, that the thermal treatment be carried out on a heating plate and/or using homogeneous irradiation.

In the event that multiple substrates 3 or caps 7 or micromechanical components 1 of a wafer or of multiple wafers of a wafer stack are brought to a higher temperature, it is provided, for example, that the thermal treatment be carried out on a heated wafer coating and/or using homogeneous irradiation, e.g., during third method step 103.

In the event that lateral region 15 is brought to the higher temperature, it is provided, for example, that the thermal treatment be performed using a spatially restricted heat source or a heat source that is locally restricted in space. In other words, it is provided, for example, that the further absorbing part of substrate 3 or cap 7 be developed locally, e.g., locally around access opening 11, for instance. In this context, it is provided that the thermal treatment be carried out using a further laser, a light-emitting diode (LED), a laser diode, and/or a flash lamp, for example. This advantageously allows for a locally restricted temperature increase. For instance, it is provided here that the energy or heat be introduced in third method step 103 using a laser pulse or multiple laser pulses of the laser or using a welding pulse of the laser. It is provided, for example, that the thermal treatment be carried out temporally before, during, and/or after the welding pulse, so that a three-dimensionally restricted heating of the welding-spot environment or a three-dimensionally restricted further absorbing part of substrate 3 or cap 7 is induced. For example, it is alternatively or additionally provided that a one-dimensionally restricted direct heat introduction be achieved, e.g., using a large-surface and pulsed illumination of substrate 3 or the cap using a flash lamp or multiple flash lamps, for example. In the context of the present invention, a one-dimensionally restricted heat introduction, for instance, means that the heat introduction into the depth of the substrate or the cap is restricted, in the sense of a surface of the substrate or the cap that is facing away from the first cavity, and in the direction of the first cavity. In other words, the meaning of a one-dimensionally restricted heat introduction, for instance, is that the wafer or the substrate or the cap is superficially heated, such as on a surface of the substrate or the cap that faces away from the first cavity. In this context, it is provided that the surface be heated across its full extension, for instance.

As a result, the present invention provides a global and/or a local temperature management of the substrate and/or the cap, in which the stresses left behind in the component by the temperature management are able to be reduced in comparison with the related art.

For instance, it is provided that the temperature management includes a reduction of temperature gradients in the substrate and/or the cap. The reduction of the temperature gradients in the substrate and/or in the cap in this instance is achieved through a global increase of the substrate temperature and/or through a local increase of the temperature in the environment of the welding spot immediately prior to, during, and/or immediately following the third method step, for example. As a result, the present invention provides a particularly simple and cost-effective method that makes it possible to avoid a component failure due to tears, or to minimize the likelihood of a component failure as a result of tears.

What is claimed is:

1. A method for producing a micromechanical component that includes a substrate and a cap that are connected to each other and that enclose a first cavity, a first pressure prevailing in the first cavity, and a first gas mixture having a first chemical composition being enclosed within the first cavity, the method comprising:

in a first step, forming in the substrate or in the cap an access opening that connects the first cavity to an environment external to the micromechanical component;

in a second method step, setting at least one of the first pressure and the first chemical composition in the first cavity;

in a third method step, laser sealing the access opening by introducing energy or heat into an absorbing part of the substrate or the cap, thereby liquefying the absorbing part, the liquefied absorbing part thereafter cooling and solidifying; and in a fourth method step, which is carried out temporally at least one of before, during, and after the third method step, performing a thermal treatment of the substrate or the cap at least in a region that is adjacent to the absorbing part and that does not liquefy in the third method step, the thermal treatment reducing temperature gradients in the substrate or in the cap between the absorbing part and the region that is adjacent to the absorbing part.

2. The method of claim 1, wherein the thermal treatment includes raising a temperature of an entirety of the substrate or the cap.

3. The method of claim 1, wherein the thermal treatment is carried out on a heating plate.

4. The method of claim 1, wherein the thermal treatment is carried out using a spatially restricted heat source.

5. The method of claim 1, wherein the thermal treatment is carried out using at least one of a laser, a light-emitting diode (LED), a laser diode, and a flash lamp.

6. The method of claim 1, wherein the thermal treatment is performed includes raising the temperature of only the region that is adjacent to the absorbing part, the region consisting of a surface of the substrate or the cap that faces away from the first cavity.

7. The method of claim 1, wherein the thermal treatment is carried out using a homogenous irradiation.

8. The method of claim 1, wherein the fourth method step is carried out before the third method step.

9. The method of claim 1, wherein the fourth method step is carried out during the third method step.

10. The method of claim 1, wherein the fourth method step is carried out after the third method step.

11. The method of claim 1, further comprising, in a fifth method step that is carried out prior to the first method step, bonding the substrate and the cap to each other.

12. The method of claim 1, further comprising, in a fifth method step that is carried out after the first method step, bonding the substrate and the cap to each other.

* * * * *